(12) United States Patent
Giduturi

(10) Patent No.: US 11,763,910 B2
(45) Date of Patent: Sep. 19, 2023

(54) MULTI-COMMAND MEMORY ACCESSES

(71) Applicant: Micron Technology, Inc., Boise, ID (US)

(72) Inventor: Hari Giduturi, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 51 days.

(21) Appl. No.: 17/506,421

(22) Filed: Oct. 20, 2021

(65) Prior Publication Data
US 2023/0117173 A1 Apr. 20, 2023

(51) Int. Cl.
*G11C 29/12* (2006.01)
*G11C 29/42* (2006.01)
*G11C 7/10* (2006.01)

(52) U.S. Cl.
CPC ............ *G11C 29/42* (2013.01); *G11C 7/1069* (2013.01); *G11C 7/1096* (2013.01); *G11C 29/12015* (2013.01)

(58) Field of Classification Search
CPC ..... G11C 29/42; G11C 7/1069; G11C 7/1096; G11C 29/12015
USPC .................................................... 365/185.09
See application file for complete search history.

(56) References Cited

U.S. PATENT DOCUMENTS

| | | | | |
|---|---|---|---|---|
| 10,043,577 B2 * | 8/2018 | Shimizu | ............. | G11C 13/0069 |
| 10,622,043 B2 * | 4/2020 | Nguyen | .................... | G11C 8/04 |
| 10,896,737 B2 * | 1/2021 | Moriyasu | ........... | G11C 16/0425 |
| 11,526,453 B1 * | 12/2022 | Mazumder | ........... | G11C 7/1093 |
| 2004/0264264 A1 | 12/2004 | Yaegashi et al. | | |
| 2005/0052913 A1 * | 3/2005 | Brox | .................... | G11C 7/1078 365/202 |
| 2007/0088903 A1 * | 4/2007 | Choi | .................... | G11C 7/1066 711/100 |
| 2018/0143779 A1 | 5/2018 | Frid et al. | | |
| 2019/0066818 A1 | 2/2019 | Lee et al. | | |
| 2019/0325957 A1 | 10/2019 | Tortorelli et al. | | |
| 2021/0312974 A1 * | 10/2021 | Kim | ........................ | G11C 8/12 |
| 2022/0068332 A1 * | 3/2022 | Lee | ........................ | G11C 7/222 |

FOREIGN PATENT DOCUMENTS

KR 20150011018 A 1/2015

OTHER PUBLICATIONS

International Search Report & Written Opinion For PCT Application No. PCT/US2022/041074, dated Dec. 16, 2022, 9 Pages.

* cited by examiner

*Primary Examiner* — Ly D Pham
(74) *Attorney, Agent, or Firm* — Fletcher Yoder, P.C.

(57) ABSTRACT

Memory devices may perform read operations and write operations with different bit error correction rates to satisfy a bit error correction rate. However, improving the bit error correction rate of the memory device using a single type of read command and/or write commands may result in longer read and write commands. Moreover, using longer read and write commands may result in undesirable higher memory power consumption and may reduce memory throughput. Accordingly, memory operations are described that may use combination of commands with increased bit error correction capability and reduced bit error correction capability. For example, the read operations may use multiple (e.g., at least two) sets or groupings of read commands and the write operations may use multiple (e.g., at least two) sets or groupings of write commands.

21 Claims, 4 Drawing Sheets

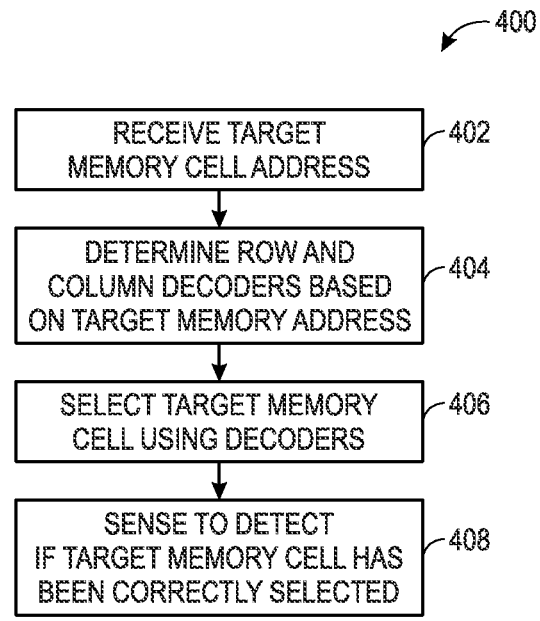
*FIG. 4*
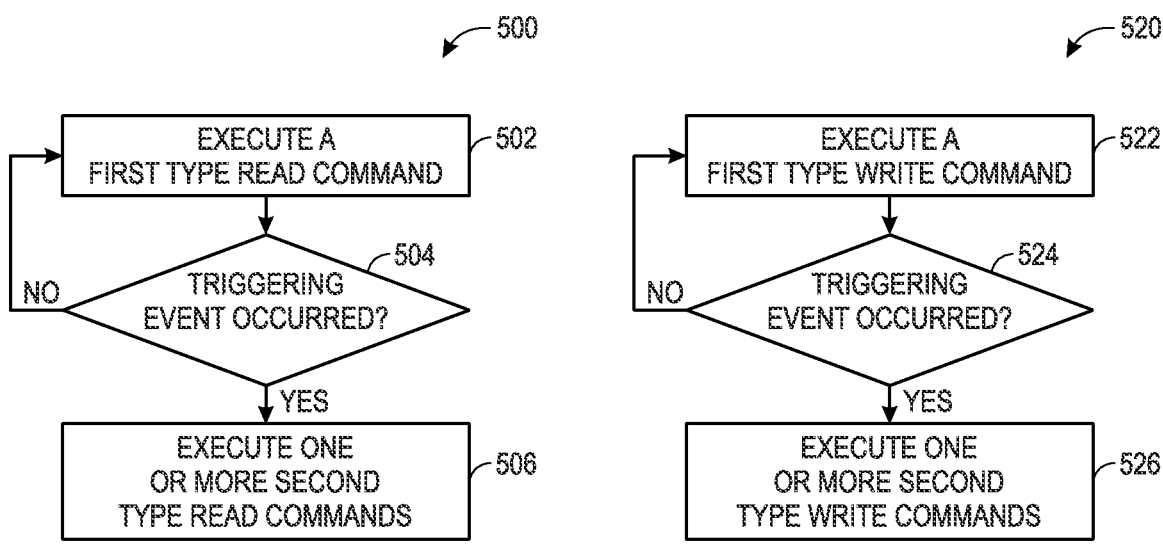
*FIG. 5A*  *FIG. 5B*

MULTI-COMMAND MEMORY ACCESSES

BACKGROUND

Field of the Present Disclosure

Embodiments of the present disclosure relate generally to the field of semiconductor devices. More specifically, embodiments of the present disclosure relate to improved read and write memory operations of threshold-type memories.

Description of Related Art

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Generally, a computing system includes processing circuitry, such as one or more processors or other suitable components, and memory devices, such as chips or integrated circuits. One or more memory devices may be used on a memory module, such as a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include instructions executable by the processing circuitry to perform an operation and/or may include data to be used as an input for such operation. In addition, in some cases, data output from the operation may be stored in memory, such as to enable subsequent retrieval of data from the memory.

Some memory devices include memory cells that may be accessed by turning on a transistor that couples the memory cell (e.g., a capacitor) with a word line or a bit line. In contrast, threshold-type memory devices may include memory devices that are accessed by providing a voltage across a memory cell, where the data value is stored and/or retrieved based on the threshold voltage of the memory cell. For example, the data value may be based on whether the threshold voltage of the memory cell is exceeded and, in response to the voltage provided across the memory cell, the memory cell conducts current. The data value stored may be changed, such as by applying a voltage sufficient to change the threshold voltage of the memory cell. Moreover, the data value may be retrieved (i.e., read) by applying sufficient voltage to allow access to the stored voltage of the memory cell. One example of a threshold-type memory cell may be a cross-point memory cell (Xpoint memory cell).

As described, providing threshold voltages indicate when certain actions are performed in threshold-type memories. However, this threshold may deviate due to reliability issues such as bias disturb, read disturb, and/or cycling, among other things, and may cause inconsistent characteristics between different threshold-type memory cells of a threshold-type memory device. For example, the reliability issues may result in deviation of threshold voltage of different memory cells as the read or bias disturbs may affect the memory operations of the threshold-type memory cells. Moreover, biasing voltage and/or current applied to different threshold-type memory cells may become different due to an architecture used by the threshold-type memory devices. For example, different electrical distances of threshold-type memory cells may result in different levels of spike currents and resistor-capacitor (RC) transients.

The described reliability issues may cause erroneous write and/or read operations when using threshold-type memory devices. Conventionally, reliable memory read and write operations may trade-off bit error rate with lower memory throughput and increased power consumption. For example, conventional reliable memory operations, such as re-reading the memory and the use of particular Error Correction Code (ECC) schemes and techniques, may reduce the bit error rate at the cost of lower memory throughput and increased power consumption. Accordingly, improved memory read and write operations are desired to improve memory bit error performance while alleviating memory throughput and power consumption.

BRIEF DESCRIPTION OF DRAWINGS

FIG. 4 illustrates a flow chart of a method for writing data to or reading data from a target memory address within a memory device, such as the memory devices of FIGS. 1 and/or 2, in according to an embodiment of the present disclosure;

FIG. 5A illustrates a process for memory read operations using constricted read operations and drawn-out read operations performed by a memory device, such as the memory devices of FIGS. 1 and/or 2, in according to an embodiment of the present disclosure; and FIG. 5B illustrates a process for memory write operations using constricted read operations and drawn-out read operations performed by a memory device, such as the memory devices of FIGS. 1 and/or 2, in according to an embodiment of the present disclosure.

DETAILED DESCRIPTION

Figure 1:
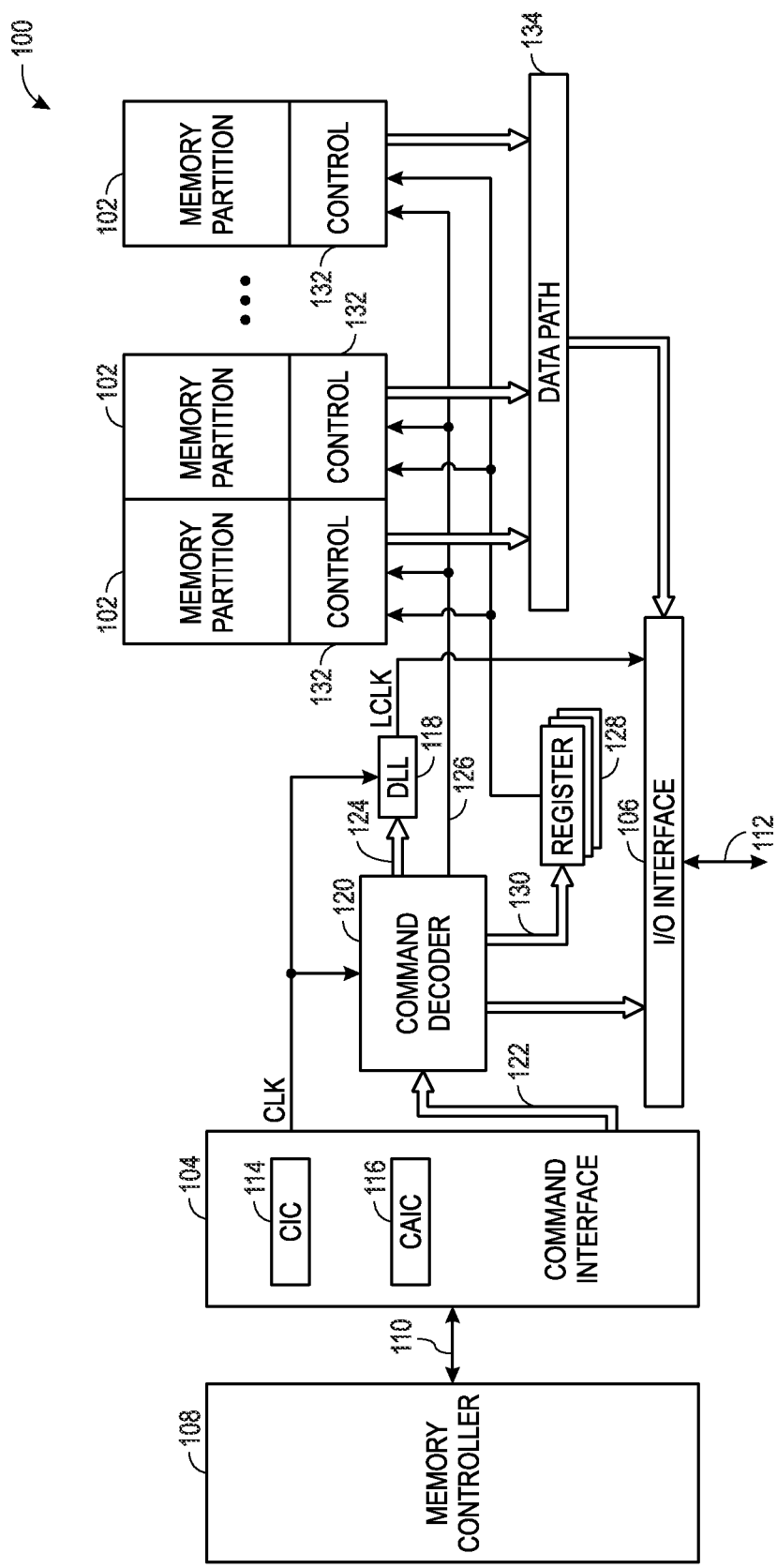
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such development efforts might be complex and time consuming, but would nevertheless be a routine undertaking of design, fabrication, and manufacture for those of ordinary skill having the benefit of this disclosure.

Memories generally include an array of memory cells, where each memory cell is coupled between at least two access lines. For example, a memory cell may be coupled to access lines, such as a bit line and a word line. Each access line may be coupled to a large number of memory cells. To select a memory cell, one or more drivers may provide selection signals (e.g., a voltage and/or a current) on the access lines to access storage capacities of the memory cell. By applying voltages and/or currents to the respective access lines, the memory cell may be accessed, such as to write data to the memory cell and/or read data from the memory cell.

In some memories, memory cells of the array may be organized into decks of memory cells. A deck of memory cells may be a single plane of memory cells disposed between a layer of word lines and a layer of bit lines. The array may be a stack of decks that includes any number of decks of memory cells (e.g., 1 deck, 2 decks, 4 decks, any number of decks) as different layers of the array.

Within a deck, a two-dimensional (2D) or three-dimensional (3D) array of memory cells may be arranged at different intersections of the word lines and the bit lines in the plane. For example, threshold-type memory devices may include 3D array of memory cells. The threshold-type memory device may use a threshold voltage (VTH) to access the respective memory cells. In some embodiments, threshold-type memory cells of 3D arrays may be read from and written to by providing different VTH to the respective access lines. For example, the threshold-type memory device may read a stored value from a threshold-type memory cell using a read VTH and write a value to the threshold-type memory cell using a write VTH.

That said, different threshold-type memory cells of such 3D array may suffer from reliability issues due to bias disturb, read disturb, cycling, and/or cell architecture. In particular, such reliability issues may result in a deviation of VTH (e.g., read VTH and/or write VTH) for different threshold-type memory cells that may cause the memory operations to fail. Accordingly, the threshold-type memory devices may incorporate reliable read commands and write commands with sufficient bit error correction capability that may account for such reliability issues. Moreover, it should be appreciated that in some embodiments, 2D arrays of memory cells may experience similar issues and may benefit from reliable read and write commands described herein.

In some embodiments, sufficient bit error correction capability may correspond to a specified (e.g., predetermined, selected, or minimum) bit error correction rate capability of a memory device in a memory system, when performing memory read and/or memory write operations. For example, the memory device may perform memory operations using read commands and write commands that may provide a bit error correction rate, in accordance with a bit error correction rate indicated by the memory device or the memory system. Read operations and write operations are described herein that may provide sufficient bit error correction capability corresponding to a specified (e.g., predetermined, selected, or minimum) bit error correction rate of the memory device, while increasing memory throughput and reducing memory power consumption.

Different memory read operations and write operations may use different bit error correction techniques to satisfy the bit error correction rate of the memory device. In some embodiments, the read operations or the write operations may include re-reading or re-writing the memory device and/or using more robust Error Correction Code (ECC) with respective read/write commands to increase the bit error correction rate of the memory device. As such, improving the bit error correction rate of the memory device using a single type of read operation and/or write operation may result in longer read and write commands. Moreover, using longer read and write commands may result in increased memory power consumption and reduced memory throughput.

Accordingly, memory operations are described herein that may use combination of memory operations with increased bit error correction capability and reduced bit error correction capability. For example, the read operations may use multiple (e.g., at least two) sets or groupings of read operations and the write operations may use multiple (e.g., at least two) sets or groupings of write commands. The read operations may include using a first read operation with increased bit error correction capability in conjunction with a second read operation with reduced bit error correction capability. Similarly, the write operations may include a first write operation with increased bit error correction capability in conjunction with a second write operation with reduced bit error correction capability.

In some embodiments, memory read and write operations may use the commands with reduced bit error correction capability more frequently. The frequent use of the commands with reduced bit error correction capability may result in increased memory throughput and reduced memory bit error correction rate. In such embodiments, to compensate for the reduced memory bit error correction rate, the memory read and memory write operations may use the commands with increased bit error correction capability to increase total bit error correction rate of the memory device.

In such embodiments, infrequent use of the commands with increased bit error correction capability (e.g., drawn-out read operations) along with the commands with reduced bit error correction capability (e.g., constricted read operations) may result in satisfaction of the memory bit error correction rate while not reducing the memory throughput by considerable margins. That is, the combined use of memory operations with increased and reduced bit error correction capability may satisfy a bit error correction rate of a respective memory device while improving the memory throughput and power consumption, as will be appreciated.

The 3D memory arrays may implement the combined use of the memory read and also memory write operations with increased and reduced bit error correction capability. For example, the 3D memory arrays may benefit from the combined use of memory read/write operations with increased and reduced bit error correction capability by energizing respective access lines on both sides of a target memory cell. Moreover, in specific embodiments, similar access methods for reading from and writing to the memory cells of a 3D memory array (e.g., providing read VTH and write VTH to the cell) may allow the memory write throughput to be substantially close or equal to the memory read throughput.

With the foregoing in mind, a memory device may use multiple (e.g., at least two) sets or groupings of read operations to access memory cells when performing read operations. The memory device may use a constricted read operation using first type read commands in conjunction with a drawn-out read operation using second type read commands. The first type read commands, may be referred to as short read commands, may use first type read instructions or short read instructions, and the second type read commands, may be referred to as long read commands, may use second type read instructions or long read instructions.

Performing memory read operations using longer read instructions may result in longer read latency. Moreover, such longer read latency may result in reduced memory throughput and increased power consumption. However, the longer read instructions may provide increased bit error correction rate when performing read operations. In some embodiments, the drawn-out read operations may use a more robust error correction scheme compared to the constricted read operations.

In contrast, first type read instructions may use an error correction scheme with reduced error correction capability. For example, in different embodiments, the constricted read operations may use a first type of error correction scheme that may detect 1 error and correct 0 or 1 of the detected errors whereas the drawn-out read operations may use a second type of error correction scheme (e.g., either a different type of error correction or more robust application of a same type of error correction as applied in the first type of error correction scheme), which may detect 2, 3, 4, etc. errors and correct 1, 2, 3, etc. of the detected errors.

Performing constricted read operations may increase the memory read throughput and reduce memory power consumption. However, in some embodiments, the first type read instructions or the short read instructions may provide insufficient error correction capability. Accordingly, the memory device may use the constricted read operations in conjunction with the drawn-out read operations to provide sufficient error correction rate during memory operations while increasing memory read throughput and reducing memory power consumption.

That said, in specific embodiments, to achieve sufficient error correction rate during memory read operations, the memory device may use one (or multiple) drawn-out read operations with multiple constricted read operations. A drawn-out read operation may provide additional bit error correction capability that may account for possible bit error correction insufficiencies when using the constricted read operations. In one embodiment, the memory device may use one or more drawn-out read operation after executing a threshold number of constricted read operations. In another embodiment, the memory device may use the drawn-out memory operations based on a triggering event. For example, the memory device may trigger the use of one or more drawn-out memory operations when identifying one or more uncorrectable errors when using the constricted memory operations.

Similarly, a memory device may use multiple (e.g., at least two) sets or groupings of write operations and commands to access memory cells when performing write operations. The memory device may use a constricted write operation using first type write commands including short write instructions or first type write instructions in conjunction with one or more drawn-out write operations. The drawn-out write operations may use the second type write commands or long write commands with second type write instructions. The second type write instructions may use longer instructions than the first type write instructions. In one embodiment, a first type write instruction may include a single pulse to access a respective memory cell while the second type write instructions may include multiple pulses.

The longer write instructions (e.g., the second type write instructions) associated with the drawn-out write operations may provide increased error correction capability. For example, the second type write instructions of the drawn-out write operations may include a more robust error correction scheme compared to the first type write instructions of the constricted write operations. However, using the drawn-out write operations may reduce the memory write throughput and increase the memory power consumption.

In contrast, the constricted write operations may include limited error correction capability. Accordingly, in some embodiments, the constricted write operations may provide insufficient error correction capability when performing memory write operations. However, using the constricted write operations may increase the memory write throughput and reduce memory power consumption.

Accordingly, performing memory write operations using the constricted write operations in conjunction with drawn-out write operations may result in sufficient error correction capability while improving the memory throughput and power consumption. That is, the memory device may use the constricted write operations to improve memory throughput and power consumption while the memory device may use (e.g., trigger the use of) the drawn-out write operations to improve the error correction rate.

To achieve sufficient error correction capability during memory write operations, the memory device may use one (or multiple) drawn-out write operation with multiple constricted write operations. In one embodiment, the memory device may use one (or multiple) drawn-out write operation after executing a threshold number of constricted write operations. In another embodiment, the memory device may use one (or multiple) drawn-out write operation based on a triggering event. For example, the memory device may trigger the use of one or more drawn-out write operations when identifying one or more uncorrectable errors using the constricted write operations.

Using such techniques, the memory device may perform read operations and write operations with sufficient bit error correction rate while improving memory throughput and power consumption. In different embodiments, the short read/write commands of constricted memory operations and long read/write commands of drawn-out memory operations may use different error correction schemes with various data length. For example, different error correction schemes may provide different error correction capability.

That said, in specific embodiments, the short read/write commands (e.g., the first type read/write commands) may provide minimum to no error correction capability while the long read/write commands (e.g., the second type read/write commands) may provide the most reliable error correction capability. For example, when using 3D memory arrays such as threshold-type memory devices, short read/write commands may use read/write instructions as short as one, two, three, four, five, ten, or another number of bits that is less than a threshold number of data bits (e.g., a short read/write command). In such embodiments, when using the short read/write commands (or the constricted memory operations), the memory device may use (trigger the use of) the long read/write commands (or the drawn-out read operations) to provide sufficient error correction capability and satisfy the bit error rate ratio of the 3D memory array.

Moreover, it should be appreciated that in different embodiments, the constricted read operations using short read commands and the drawn-out read operations using long read commands may each cause different amount of read latency. Similarly, in different embodiments, the constricted write operations and the drawn-out write operations may each include different write completion times. Furthermore, using different error correction schemes with each of the short read/write commands and long read/write commands may cause different memory read/write error correction rates. Accordingly, the memory device may use the multiple sets or groupings of read commands and/or the multiple sets or groupings of write commands to access memory cells when performing read operations and/or write operations to improve memory throughput and power consumption while providing sufficient bit error correction capability.

Turning now to the figures, FIG. 1 depicts a simplified block diagram illustrating certain features of a memory device 100. Specifically, the block diagram of FIG. 1 depicts a functional block diagram illustrating certain functionality of the memory device 100. In accordance with one embodiment, the memory device 100 may include a random access memory (RAM) device, a dynamic RAM (DRAM) device, a static RAM (SRAM) device (including a double data rate SRAM device), flash memory, and/or a 3D memory array including phase change (PC) memory and/or other chalcogenide-based memory, such as self-selecting memories (SSM). Moreover, each memory cell of such 3D memory array may include a corresponding logic storing device (e.g., a capacitor, a resistor, or the resistance of the chalcogenide material(s)).

In some embodiments, the SSM memory may include threshold-type memory cells as non-volatile memory cells. Moreover, the threshold-type memory cells may use chalcogenide material to allow for state changes of the threshold-type memory cells. Furthermore, such memory device 100 may use similar memory cell access techniques to read from and write to the respective threshold-type memory cells using different VTH (e.g., read VTH and write VTH). For example, the memory device 100 may read a value from or write a value to a threshold-type memory cell by applying read VTH or write VTH, respectively, across the chalcogenide material of the threshold-type memory cell. SSM memories may include a sole active element in each memory cell acting both as a selector element and as a memory element. The active element may comprise a chalcogenide material that does not undergo any phase change when programmed in different logic states. In some examples, SSM memories may be programmed to different logic states with programming pulses of different polarity and/or amplitude.

Similarly, the PC memory may include non-volatile memory cells using chalcogenide material, including Phase Change material, to allow for state changes of memory cells therein. In some examples, PC memories may include a select device element and a memory element that may comprise a phase-change material. The PC memory may be read from or written to by manipulating, for example, a crystalline phase of the phase-change material including a relative low resistance to an amorphous phase having a relative high resistance.

The crystalline phase may include an orderly phase of the phase-change material associated with the memory cells of the PC memory. Moreover, the amorphous phase may include a disorderly phase of the phase-change material associated with the memory cells of the PC memory. The PC memory may be controlled through provision of, for example, heat to the phase-change material. The memory states themselves, based on their differences in resistivity, represent whether the PC memory cell stores "1" or "0" as a binary value. That said, the memory device 100 may use more than one set of read operations and/or write operations to read and/or write to respective memory cells of PC memories, as well as of other chalcogenide-based memories, such as SSM memories, as will be appreciated.

The memory device 100 may include a number of memory partitions 102 each inclusive of one or more memory arrays (e.g., 3D memory arrays). Various configurations, organizations, and sizes of the memory partitions 102 on the memory device 100 may be used based on an application and/or design of the memory device 100 within an electrical system. The memory device 100 may also include a command interface 104 and an input/output (I/O) interface 106. The command interface 104 is configured to provide a number of signals from a processor or controller, such as a memory controller 108. In different embodiments, the memory controller 108 may include one or more processors (e.g., memory processors), one or more programmable logic fabrics, or any other suitable processing components.

In some embodiments, a bus 110 may provide a signal path or a group of signal paths to allow bidirectional communication between the command interface 104 and the memory controller 108. Similarly, a bus 112 may provide another signal path or group of signal paths to allow for bidirectional transmission of signals, such as data signals and read/write commands (e.g., constricted read operations and/or drawn-out read operations), between the I/O interface 106, the memory controller 108, and/or other components. Thus, the memory controller 108 may provide various signals to different components of the memory device 100 to facilitate the transmission and receipt of data to be written to or read from the memory partitions 102.

In some embodiments, the memory controller 108 may perform read/write operations using more than one set of read commands and write commands. For example, the memory controller 108 may provide the constricted write operations in conjunction with the drawn-out write operations when performing write operations on different memory cells of the memory device 100. In one example, the short read commands, such as the first type read commands, may correspond to a number of pulses (e.g., clock cycles or commands) less than a threshold number of pulses (or the short read commands may correspond to a time period shorter than a threshold time period).

The long read commands, also referred to as the second read type commands, may correspond to a number of pulses greater than the threshold number of pulses (or the long read commands may correspond to a time period longer than a threshold time period). In another example, the long read commands may correspond to a number of pulses greater than a number of pulses of the short read commands (or a longer time period) based on a factor of 2, 3, 4, 5, 6, 7, 8, 9, 20, etc. Accordingly, the long read commands (or the second read type commands) may correspond to longer time periods to execute, which can allow for the implementation of more robust ECC codes and/or error correction schemes with increased ECC correction capabilities, as mentioned above.

Similarly, the memory controller 108 may provide the constricted read operations in conjunction with the drawn-out read operations when performing read operations on different memory cells of the memory device 100. Moreover, the memory controller 108 may trigger using the drawn-out read/write operations based on a triggering event, as described above. For example, the memory controller 108 may trigger using the drawn-out read/write operations based on using a threshold number of constricted read/write operations or when detecting uncorrectable memory read/write operations when using the constricted read/write operations.

The command interface 104 may receive different input signals, including the constricted read/write operations and the drawn-out read/write operations, from the memory controller 108. The command interface 104 may also receive one or more clock signals from an external device, such as the memory controller 108. The command interface 104 may include different circuitry, such as a clock input circuit 114 (CIC) and a command address input circuit 116 (CAIC). The command interface 104 may use the clock input 114 and the command address input circuit 116 to receive the input signals and facilitate communication with other components of the memory device 100.

In one embodiment, the command interface 104 may receive the input signals at the positive edges of the received clock signal. In another embodiment, the command interface 104 may receive the input signals at both positive and negative edges of the received clock signal. Moreover, the input signals may be received according to different clock length (e.g., one or more clocks are used to receive the commands).

Moreover, the clock input circuit 114 may receive the one or more clock signals and may generate an internal clock signal (CLK) therefrom. In some embodiments, the command interface 104 may provide the CLK to an internal clock generator, such as a delay locked loop (DLL) 118 circuit. In some embodiments, the DLL 118 may generate a phase controlled internal clock signal (LCLK) based on the received CLK. For example, the DLL 118 may provide the LCLK to the I/O interface 106. Subsequently, the I/O interface 106 may use the received LCLK as a clock signal for transmitting the read data using the bus 112.

The command interface 104 may also provide the internal clock signal CLK to various other components within the memory device 100. For example, a command decoder 120 may receive the internal clock signal CLK. The command decoder 120 may decode the command signals (e.g., short and long read/write commands), received via a bus 122, to provide internal commands to different memory cells. For instance, the command decoder 120 may provide command signals to the DLL 118 over a bus 124 to coordinate generation of the command signals in-line with the LCLK.

Accordingly, the command decoder 120 may decode and/or provide commands, such as the short and the long read/write commands, among other commands, and provide access to different memory partitions 102, via bus path 126. The command decoder 120 may also transmit various signals to one or more registers 128 via, for example, one or more global wiring lines 130. The memory device 100 may also include other decoders, such as row decoders and column decoders, to facilitate access to the memory partitions 102, as will be appreciated.

In one embodiment, each memory partition 102 may include a control block 132. Each of the control blocks 132 may provide row decoding and column decoding capability for accessing the memory cells of the respective memory partitions 102. The control blocks 132 may also provide timing control and data control functions to facilitate execution of different commands with respect to the respective memory partitions 102.

Moreover, the command decoder 120 may provide register commands to the one or more registers 128 to facilitate operations of one or more of the memory partitions 102, the control blocks 132, and the like. For example, one of the one or more registers 128 may provide instructions to configure various modes of programmable operations and/or configurations of the memory device 100. The one or more registers 128 may be included in various semiconductor devices to provide and/or define operations of various components of the memory device 100.

In some embodiments, the one or more registers 128 may provide configuration information to define operations of the memory device 100. For example, the one or more registers 128 may include operation instructions for DRAMs, synchronous DRAMs, chalcogenide memories (e.g., SSM memory, PC memory), or other types of memories. As discussed above, the one or more registers 128 may receive various signals from the command decoder 120, or other components, via the one or more global wiring lines 130.

In some embodiments, the one or more global wiring lines 130 may include a common data path, a common address path, a common write command signal path, and a common read command signal path. The one or more global wiring lines 130 may traverse across the memory device 100, such that each of the one or more registers 128 may couple to the global wiring lines 130. The additional registers may involve additional wiring across the semiconductor device (e.g., die), such that the registers are communicatively coupled to the corresponding memory components.

With the foregoing in mind, the memory device 100 may perform constricted memory read and write operations using the first type or short read/write commands and drawn-out memory read and write operations using the second type or long read/write commands. In specific embodiments, the memory device 100 may perform the constricted and drawn-out memory read and write operations using the memory controller 108. For example, the memory controller 108 may receive (and provide) a number of constricted read/write operations, including address instructions, to access respective memory cells on one or of the memory partitions 102 followed by one or more drawn-out read/write operations. As discussed above, the constricted read/write operations may increase the memory throughput while the drawn-out read/write operations may provide more robust error correction capability.

In some embodiments, the memory controller 108 may trigger using (e.g., receiving and providing) one or more drawn-out read/write operations based on performing a threshold number of constricted read/write operations. For example, the memory controller 108 may trigger using one drawn-out read/write operation after performing one hundred constricted read/write operations. In different embodiments, the memory controller 108 may trigger using (e.g., receiving and providing) one or more long read/write commands of the drawn-out read/write operations based on detecting uncorrectable memory read or write value when using the constricted read/write operations.

Accordingly, the memory device 100 may perform read operations and write operations on the respective memory cells using a higher memory throughput and reduced power consumption while maintaining an error correction rate. Moreover, the memory controller 108 may clock the short and the long read/write commands of the constricted and drawn-out read/write operations to the command interface 104 using received clock signals. Furthermore, the command interface 104 may use the command address input circuit 116 to receive and transmit the constricted and the drawn-out read/write operations to the command decoder 120.

Accordingly, the memory controller 108 may access the memory cells of the memory partitions 102, via the command interface 104 and the command decoder 120. Access path to specific memory cells of the memory partitions 102 within the memory device 100 can be encoded in the constricted read/write operations and the drawn-out read/write operations. Moreover, and as described above, the constricted read/write commands and the drawn-out read/write operations may each include different number of command bits (command bit length). For example, in some embodiments, the constricted read/write operations may include first type instructions with a bit length shorter by a factor of 10 with respect to a bit length of the second type instructions associated with the drawn-out read/write operations.

The command interface 104 may also receive a number of other command signals. For example, a reset command may be used to reset the command interface 104, status registers, state machines and the like, during power-up. Various testing signals may also be provided to the memory device 100. For example, the memory controller 108 may use such testing signals to test connectivity of different components of the memory device 100. In some embodiments, the command interface 104 may also provide an alert signal to the memory controller 108 upon detection of an error in the memory device 100. Moreover, the I/O interface 106 may additionally or alternatively be used for providing such alert signals, for example, to other system components electrically connected to the memory device 100.

The I/O interface 106 may facilitate data communication with external components based on different operations of the memory device 100. Particularly, the data may be sent to or retrieved from the memory partitions 102 over the data path 134, which includes a plurality of bi-directional data buses to one or more external device via the I/O interface 106. For certain memory devices, such as a DDR5 SDRAM memory device, the I/O signals may be divided into upper and lower bytes; however, such segmentation is not utilized in conjunction with other memory device types.

That said, in different embodiments, the memory device 100 may include additional or alternative components. That is, the memory device 100 may include additional or alternative components such as power supply circuits (for receiving external VDD and VSS signals), read/write amplifiers (to amplify signals during read/write operations), temperature sensors (for sensing temperatures of the memory device 100), etc. Accordingly, it should be understood that the block diagram of FIG. 1 is only provided to highlight certain functional features of the memory device 100 to aid in the subsequent detailed description.

Figure 2:
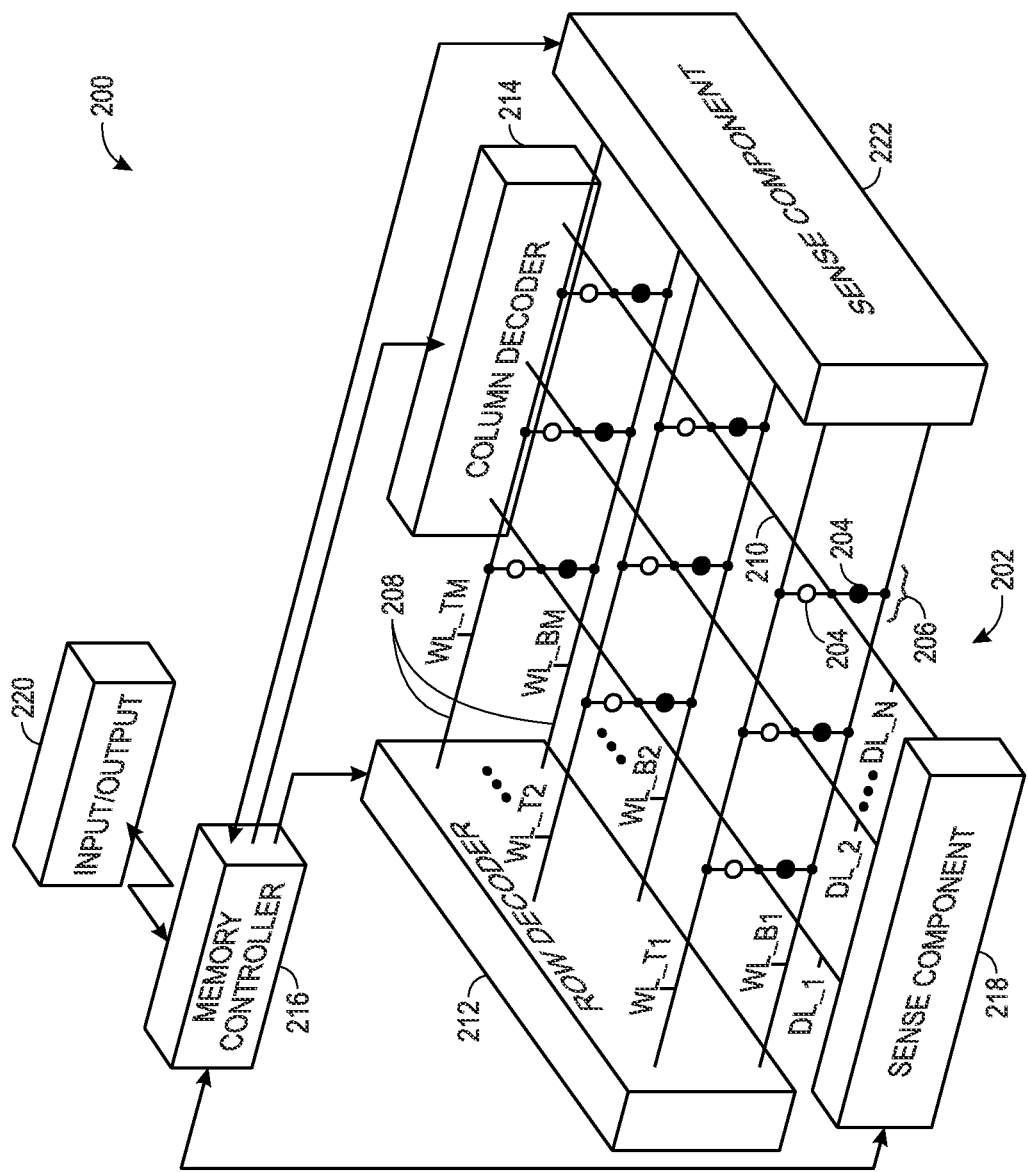
FIG. 2 illustrates perspective view of a memory device with 3-dimensional memory cell architecture, such as the memory device of FIG. 1, according to an embodiment of the present disclosure.

FIG. 2 illustrates an example memory device 200 in accordance with some embodiments of the present disclosure. In some embodiments, the memory device 200 may be similar to the memory device 100. The memory device 200 may include a 3D memory array 202. In some embodiments, the 3D memory array 202 may include the PC memory and/or the SSM memory described above and may benefit from performing read operations and/or write operations using multiple (e.g., at least two) sets or groupings of commands. Specifically, the 3D memory array 202 may benefit from performing read operations and/or write operations using the short read/write commands and the long read/write commands. That said, the memory device 200 may illustrate functional interrelationships and may not represent the actual physical positions of such components within the memory device 200.

The 3D memory array 202 may include memory cells 204 that may be programmable to store different states. In some embodiments, each memory cell 204 may be programmable to store two states, denoted as a logic 0 and a logic 1. However, in some embodiments, each memory cell 204 may store more than two logic states. As discussed above, in some embodiments, the memory cells 204 may include a Phase Change Cell (PC cell), such as a 3D XPoint (crosspoint) memory cell, or a chalcogenide-based memory cell, such as a SSM memory cell. Accordingly, in such embodiments, the memory cells 204 may include threshold-type memory cells and may be accessed by providing respective read or write VTH to the respective access lines of each targeted memory cell. Furthermore, although some elements included in FIG. 2 are labeled with a numeric indicator, other corresponding elements may not be labeled, in an effort to increase visibility and clarity of the depicted features.

The 3D memory array 202 may include two or more 2D memory arrays formed adjacent to one another (e.g., on top of or next to one another). In some embodiments, such arrangement of the 3D memory array 202 may increase a number of memory cells 204 on a respective die or substrate as compared with 2D arrays. As such, using the 3D memory array 202 may reduce production costs, increase the performance of the memory device, or both.

The depicted 3D memory array 202 may include two levels of memory cells 204. However, it should be appreciated that in different embodiments, the 3D memory array 202 may include different number of memory cell levels. That is, the 3D memory array 202 may not be limited to two levels of memory cells 204 and may include a different number of levels. Each level of memory cells 204 may be aligned or positioned such that the respective memory cells 204 may be aligned (exactly, overlapping, or approximately) with one another across each level to form a memory cell stack 206. In some cases, the memory cell stack 206 may include two PC cells (e.g., two 3D XPoint memory cells), two SSM cells, or a combination of both, with one disposed above the other.

In the depicted embodiment, each row of the memory cells 204 may be connected to a word line 208, and each column of memory cells 204 may be connected to a bit line 210. Moreover, the word lines 208 and the bit lines 210 may be substantially perpendicular to one another to create an array of memory cells. Furthermore, the two adjacent memory cells 204 in the memory cell stack 206 may share a common bit line 210. That is, the bit line 210 may be in electronic communication with the bottom electrode of the upper memory cell 204 and the top electrode of the lower memory cell 204 of each memory cell stack 206.

In other embodiments, each of the memory cells 204 (e.g., the upper memory cell 204 and the lower memory cell 204) may include a dedicated bit line 210. In such embodiments, the memory cells 204 may be separated by an insulation layer. Other configurations of the memory cells 204 in the 3D memory array 202 may include a third layer sharing a word line 208 with a lower layer. Nevertheless, each memory cell 204 may be positioned at an intersection of two conductive lines, such as one word line 208 and one bit line 210. Such intersection may correspond to an address of the respective memory cell 204.

A target memory cell 204 may be accessed by applying an appropriate current or an appropriate voltage at the intersection of the respective word line 208 and the respective bit line 210. That is, the respective word line 208 and the respective bit line 210 may be energized, with a respective read VTH or write VTH, in order to read from or write to the memory cells 204.

Electrodes may be coupled to the memory cells 204 between the respective word lines 208 and bit lines 210. The term electrode may refer to an electrical conductor, and in some cases, may be employed as an electrical contact to the memory cell 204. An electrode may include a trace, wire, conductive line, conductive layer, or the like that provides a conductive path between elements or components of the memory device 200. In some embodiments, the memory cells 204 may include a chalcogenide alloy positioned between a first electrode and a second electrode. The chalcogenide alloy may store a logic value (e.g., as the logic storing device) written to respective memory cells 204.

One side of the first electrode may be coupled to the word line 208 and the other side of the first electrode may be coupled to the chalcogenide alloy. In addition, one side of the second electrode may be coupled to the bit line 210 and the other side of the second electrode may be coupled to the chalcogenide alloy. The first electrode and the second electrode may include the same material (e.g., carbon) or different materials.

In specific embodiments, the memory cell 204 may include an additional electrode to separate the chalcogenide alloy into two parts. A first part of the chalcogenide alloy may have a different composition than a second part of the chalcogenide alloy. In some embodiments, the first part of the chalcogenide alloy may have a different function than the second part of the chalcogenide alloy. The additional electrode may be the same material (e.g., carbon) or different than the first electrode and/or the second electrode.

That said, memory read and write operations may be performed on memory cells 204 by providing selection signals to the respective word lines 208 and bit lines 210. In some embodiments, the selection signals are interchangeable between the word lines 208 and the bit lines 210 of the 3D memory array 202. Moreover, as discussed above, the selection signals may include a respective voltage selected according to a respective VTH for reading from or writing to the memory cells 204. For example, the selection signals may include a first voltage for writing a value on the memory cells 204 while the selection signals may include a different voltage for reading a value stored on the memory cells 204.

In different embodiments, the word lines 208 and the bit lines 210 may include conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like. Moreover, in some embodiments, the logic storing device of the memory cells 204 may be electrically isolated from the respective bit lines 210 by a selection component. In such embodiments, the respective word lines 208 may be connected to the selection component. For example, the selection component may be a transistor and the word line 208 may be connected to a gate, a source, and/or a drain of the transistor.

Energizing the word lines 208 may result in an electrical connection (e.g., closed circuit connection) between the logic storing device of the respective memory cells 204 and the corresponding bit lines 210. The bit lines 210 may also be energized to access (e.g., read or write) the respective memory cells 204. When reading the memory cells 204, the resulting signal upon accessing the memory cells 204 may indicate the stored logic state of the respective memory cells 204.

In some embodiments, a first logic state may correspond to no current or a small current, whereas a second logic state may correspond to an amount of current greater than a threshold. In different embodiments, the memory cells 204 may include a 3D XPoint memory cell, a self-selecting memory (SSM) cell, or a chalcogenide-based memory cell having two terminals. As such, the terminals of each 3D XPoint memory cell, the SSM cell, or the chalcogenide-based cell may be electrically connected to a respective word line 208 and a respective bit line 210.

A row decoder 212 and a column decoder 214 may control accessing the memory cells 204. For example, a memory controller 216 may send row address signals to the row decoder 212 to energize the appropriate word lines 208. In some embodiments, the memory controller 216 may be similar to the memory controller 108 described with respect to FIG. 1. The memory controller 216 may also send column address signals to energize the appropriate bit lines 210. For example, the 3D memory array 202 may include multiple word lines 208, labeled WL_B1 (or WL_T1) through WL_BM (or WL_TM), and multiple bit lines 210, labeled DL_1 through DL_N, where M and N depend on the array size. Thus, by energizing the appropriate word lines 208 and bit lines 210 (e.g., WL_B2 and DL_3) the respective memory cells 204 at their intersection may be accessed.

The memory controller 216 may transmit multiple (e.g., at least two) sets or groupings of read commands and/or write commands to read from and/or write to the memory cells 204 of the memory device 200. Accordingly, the memory controller 216 may transmit a combination of first type read/write commands (e.g., short read/write commands) and second type read/write commands (e.g., long read/write commands) to the row decoder 212 and the column decoder 214 when performing the constricted and/or drawn-out memory operations. For example, when performing the read operations, the memory controller 216 may transmit multiple first type read commands in conjunction with one or more second type read commands to the row decoder 212 and the column decoder 214. The row decoder 212 and the column decoder 214 may access the respective one or more memory cells 204 based on receiving the first type read commands and the second type read commands.

Similarly, when performing write operations, the memory controller 216 may transmit multiple first type write commands in conjunction with one or more second type write commands to the row decoder 212 and the column decoder 214. Accordingly, the row decoder 212 and the column decoder 214 may access the respective one or more memory cells 204 based on receiving the first type write commands and the second type write commands. In different embodiments, the memory controller 216 may use the drawn-out read/write operations after performing a threshold number of constricted read/write operations, after a threshold amount of time, or upon detection of failed memory read/write operation using the constricted read/write operations. Moreover, by using the combination of the constricted and drawn-out read/write operations, the memory device 200 may perform the read/write operations with sufficient bit error rate while reducing the memory power consumption and increasing the memory throughput.

With the foregoing in mind, upon accessing the memory cells 204, a sense component 218 may read (or sense) the stored logic state. For example, a voltage may be applied to the respective memory cells 204, by energizing the corresponding word line 208 and bit line 210, and a resulting current amount may determine the stored logic state of the respective memory cell 204. In one embodiment, the sense component 218 may determine a resulting voltage based on the resulting current when the memory cells 204 are accessed. The resulting voltage may indicate the stored logic state of the memory cell 204.

In some embodiments, different voltage levels may be applied to the respective memory cells 204. For example, if an applied voltage does not result in a current flow, other voltages may be applied until a current is detected by the sense component 218. Alternatively, the voltage may be ramped up in magnitude until a current flow is detected (e.g., the respective memory cell 204 turns on, switches on, conducts current, or becomes activated). In other cases, predetermined voltages may be applied sequentially until a current is detected. Similarly, a current may be applied to the memory cells 204 and the magnitude of the voltage to create the current may depend on the electrical resistance or the threshold voltage of the memory cells 204. Nevertheless, it should be appreciated that such voltage and/or current may be provided according to respective read and write VTH when performing the read and write operations.

In some embodiments, the sense component 218 may be part of the column decoder 214. In other embodiments, the sense component 218 may be positioned at a different location and be electrically connected to the column decoder 214. The sense component 218 may include various transistors or amplifiers in order to detect, amplify, and/or maintain the resulting current, which may be referred to as latching.

The detected logic state of the memory cells 204 may then be output through the column decoder 214 as output 220. FIG. 2 also illustrates a sense component 222. As illustrated, the sense component 222 may be coupled to the word lines 208 and may operate in conjunction with the row decoder 212. For example, similar to the operations of the sense component 218 described above, the sense component 222 may operate in conjunction with the row decoder 212. Moreover, in specific cases, the sense component 222 may include a row decoder similar to the row decoder 212.

Additionally, as will be described in greater detail below, the sense component 222 may also include circuitry to perform additional operations that are not performed via the sense component 218. For example, in specific embodiments, the sense component 218 may perform snap detection of a target memory cell 204 of the 3D memory array 202. In some embodiments, the column decoder 214 may include the sense component 222. Alternatively, the sense component 222 may be connected to or may be in electronic communication with the column decoder 214.

Moreover, the memory cells 204 may be set or written to by energizing the respective word lines 208 and bit lines 210 based on performing the constricted and drawn-out write commands. In different embodiments, one or more logic values may be stored in the memory cell 204. The column decoder 214 and/or the row decoder 212 may receive the first type and the second type write instructions, indicative of memory cell address and data, to be written to one or more of the memory cells 204 from the memory controller 216 and via the input/output 220. In some memory architectures, accessing the memory cells 204 may degrade or destroy the stored logic state. Accordingly, the memory device 200 may perform re-writing and/or refreshing operations after a write operation to return the original logic state to the memory cells 204.

In DRAM, for example, the capacitor of a memory cell 204 may be partially or completely discharged during a sense operation, corrupting the stored logic state. So, the logic state may be re-written after a sense operation. Additionally, in some embodiments, energizing a single word line 208 may result in the discharge of all memory cells 204 in the row. Thus, several or all memory cells 204 in the row may need to be re-written. However, in other non-volatile memory, such as SSM, PC memory (e.g., 3D XPoint memory), SSM memory, FeRAM, or 3D NAND memory, accessing the memory cells 204 may not destroy the logic state and, thus, the memory cells 204 may not be re-written after access.

In operation, the memory controller 216 may control the memory operations (e.g., read, write, re-write, refresh, discharge) of the memory cells 204 through the various components. For example, the memory controller 216 may control operations of the row decoder 212, column decoder 214, sense component 218, sense component 222, and other components that may not be shown in the depicted embodiment. In some cases, one or more of the row decoder 212, column decoder 214, sense component 218, and sense component 222 may be co-located with the memory controller 216. Based on receiving the first type and the second type read/write commands, the memory controller 216 may generate row and column address signals in order to energize the desired word lines 208 and bit lines 210. Moreover, the memory controller 216 may also generate and control various voltages or currents used during the operation of the memory device 200.

The memory controller 216 may receive user data (e.g., input data) through the input/output 220, which may be a physical connection or a path coupled to a connector of the memory device 200. In some embodiments, when performing memory read operation using the first type read instructions and/or the second type read instructions, the memory controller 216 may read a previous user data from the memory cells 204, write a new user data, and merge the new user data with the previous user data into write registers. Thereafter, mask register (MR) information may be generated, wherein the mask register information may indicate bits of the previous user data stored in the memory cells 204 to be switched or not to be switched in their logic values.

In some embodiments, the memory controller 216 may count numbers of a first logic value (logic "0") and a second logic value (logic "1") to be written using the MR information, respectively. The memory controller 216 may also store the number of the first logic values and the second logic values into a first counter and a second counter, respectively. In some embodiments, the memory controller 216 may apply a programming pulse to the memory cells 204 according to the mask register information.

In some embodiments, the memory controller 216 may adaptively adjust operations of the memory device 200 to reduce erroneous memory operations. In general, the memory controller 216 may adjust the amplitude, shape, polarity, and/or duration of an applied voltage or current discussed herein for various operations of the memory device 200. For example, during an access operation, such as a reset operation, a write operation and/or a read operation, the memory controller 216 may adaptively control the access current and/or a voltage based at least in part on the respective read/write VTH.

Moreover, the memory controller 216 may perform the constricted and the drawn-out read/write operations to access the memory cells 204 based on the adaptively controlled/adjusted access currents and/or voltages. As discussed above, the memory controller 216 may trigger the use of the second type read/write commands of the drawn-out memory operations upon detection of erroneous read/write operations when using the first type read/write commands of the constricted memory operations. Furthermore, one, multiple, or all memory cells 204 within 3D memory array 202 may be accessed simultaneously. For example, multiple or all cells of memory array 204 may be accessed simultaneously during a reset operation in which all memory cells 204, or a group of memory cells 204, are set to a single logic state.

Figure 3:
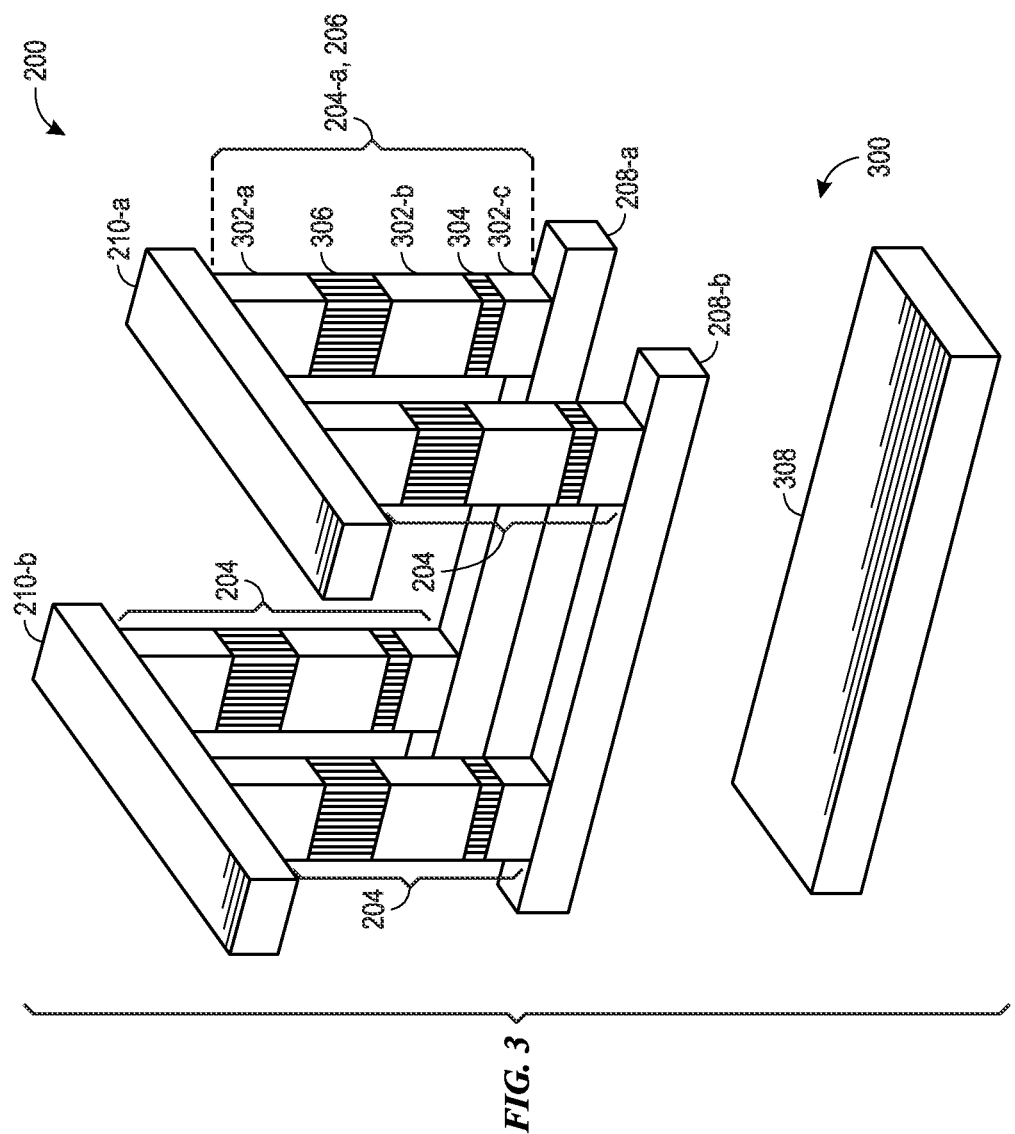
FIG. 3 illustrates a perspective view of multiple stacked memory cells of a 3-dimensional memory array that supports read and write operations using multiple (e.g., at least two) sets or groupings of commands, according to an embodiment of the present disclosure.

FIG. 3 illustrates an example of a memory array 300 that supports multiple read and write operations (e.g., constricted and drawn-out memory operations) using multiple (e.g., at least two) sets or groupings of commands (e.g., the first type and second type read/write commands) in accordance with some embodiments of the present disclosure. The memory device 200, described above, may include the memory array 300. In some embodiments, the memory array 300 may be similar to the 3D memory array 202 described above with respect to FIG. 2 and may include the memory cells 204.

Moreover, in specific embodiments, the memory array 300 may be included within the memory partitions 102 of the memory device 100 described with respect to FIG. 1.

Furthermore, the architecture of the memory array 300 may be referred to as a cross-point memory architecture. However, it should be appreciated that the depicted architecture of a cross-point memory is by the way of example and different embodiments of a cross-point memory architecture may include different components using various architecture. That said, although some elements included in FIG. 3 are labeled with a numeric indicator, other corresponding elements are not labeled in an effort to increase visibility and clarity of the depicted features.

As depicted in FIG. 3, the memory array 300 may include different portions to construct a memory cell 204-*a*. The memory cell 204-*a* is stacked in a vertical direction (e.g., perpendicular to a substrate) to create a respective memory cell stack 206. The memory array 300 may include a word line 208-*a* and a bit line 210-*a*, which may correspond to example embodiments of the word lines 208 and bit lines 210 described with reference to FIG. 2.

Illustration of the materials between the word lines 208-*a* and the bit lines 210-*a* may represent the memory cell stack 206 including one layer (e.g., lower layer or upper layer) of memory cells 204 (e.g., the memory cell 204-*a*). However, as described above with respect to FIG. 2, it should be appreciated that in different embodiments, different number of memory cell layers may be used in each of the memory cell stacks 206 (e.g., two layers, three layers, etc.).

The memory array 300 may include electrodes 302-*a*, 302-*b*, and 302-*c*, logic storage element 304, selector device element 306, and a substrate 308. In some examples, a single component including a chalcogenide alloy (not shown) may replace the selector device element 306, the logic storage element 304, and the electrode 302-*b*. Such chalcogenide alloy material may act as both the logic storage element 304 and the selector device element 306. The electrode 302-*a* may be in electronic communication with the bit line 210-*a* and the electrode 302-*c* may be in electronic communication with the word line 208-*a*.

The depicted empty spaces may include insulating materials to be electrically and/or thermally insulating. As described above, various logic states may be stored by varying the electrical resistance or stored energy of the logic storage element 304 via the selector device element 306 in PC memory and SSM memory technologies, as will be appreciated. Such various logic states may be written to the logic storage element 304 using the selector device element 306 by providing the write VTH associated with the memory cell 204-*a*. Nevertheless, a respective memory controller, such as the memory controller 216 of FIG. 2 or any other viable internal or external component to the memory device 200, may perform read and write operations on the memory cell 204-*a*. The constricted and drawn-out read and write operations may include providing the first type and second type read/write commands to read/write the various logic states on the memory cell 204-*a*.

In some embodiments, storing various logic states includes passing a current through the memory cell 204-*a*, heating the logic storage element 304 in the memory cell 204-*a*, or melting (e.g., wholly or partially) the material of the logic storage element 304 in the memory cell 204-*a*. Other storage mechanisms, such as threshold voltage modulation, may be exploited in chalcogenide-based memories. The read and write operations may be performed, to read from or write to the logic storage element 304 and/or the selector device element 306, by energizing the word line 208-*a* and the bit line 210-*a* using respective read and write VTH, provided by the first type and the second type read/write commands.

In some embodiments, the memory array 300 may include an array of memory cell stacks 206. Each memory cell stack may include one or multiple memory cells 204, similar or different from the memory cell 204-*a*. The memory array 300 may be made by forming a stack of conductive materials, such as the word lines 208 and the bit lines 210, in which each conductive material is separated from an adjacent conductive material by electrically insulating materials in between. The electrically insulating materials may include oxide or nitride materials, such as silicon oxide, silicon nitride, or other electrically insulating materials.

Such insulating materials may be formed above the substrate 308, such as a silicon wafer, or any other semiconductor or oxide substrate. Subsequently, various process steps may be utilized to form the materials in between the word lines 208 and bit lines 210 such that the memory cell 204-*a* may be coupled with the word line 208-*a* and the bit line 210-*a*.

The selector device element 306 may be electrically connected with the logic storage element 304 through the electrode 302-*b*. In some examples, the positioning of the selector device element 306 and the logic storage element 304 may be flipped. The composite stack including the selector device element 306, the electrode 302-*b*, and the logic storage element 304 may be connected to the word line 208-*a* through the electrode 302-*c* and to the bit line 210-*a* through the electrode 302-*a*.

The selector device element 306 may aid in selecting the memory cell 204-*a* by allowing current flow when the memory cell 204-*a* is selected. Moreover, the selector device element 306 may prevent currents from flowing through the memory cell 204-*a* when a different memory cell 204 is selected. In different embodiments, the selector device element 306 may include an electrically non-linear component (e.g., a non-Ohmic component) such as a metal-insulator-metal (MIM) junction, an Ovonic threshold switch (OTS), or a metal-semiconductor-metal (MSM) switch, among other types of two-terminal selector device such as a diode. In some embodiments, the selector device element may include a chalcogenide alloy. Moreover, in some examples, the selector device may include an alloy of selenium (Se), arsenic (As), silicon (Si), and germanium (Ge).

As discussed above, the memory cells 204 of FIG. 3 may include a material with a variable resistance. Variable resistance materials may refer to various material systems, including, for example, metal oxides, chalcogenides, and the like. Chalcogenide materials are materials or alloys that include at least one of the elements sulfur (S), tellurium (Te), or selenium (Se). Different chalcogenide alloys may be used—for example, a germanium-antimony-tellurium alloy (Ge—Sb—Te) is a chalcogenide material. Other chalcogenide alloys not expressly recited here may also be employed. In some embodiments, the chalcogenide alloy may replace the selector device element 306, the logic storage element 304, and the electrode 302-*b* to form the SSM memory that may enable using similar read and write instructions to access the memory cell 204-*a*.

Accordingly, when performing a combination of constricted and drawn-out read and write operations using the combination of first type and second type commands on the memory array 300, including the selector device element 306, increased memory read and write throughputs may be achieved. In some cases, the memory controller may send read and write instructions (e.g., constricted or drawn-out)

using similar read VTH and write VTH to the memory cells 204 of the memory array 300. Moreover, in alternative or additional cases, similar instructions with different VTH (e.g., read VTH and write VTH) may be used for first type read commands. In one embodiment, the read VTH may be less than a threshold voltage whereas the write VTH may be greater than the threshold voltage. For example, the read VTH may be defined with respect to a voltage range (including an upper and lower threshold) less than the threshold voltage and the write VTH may be defined with respect to a voltage range (including an upper and lower threshold) greater than the threshold voltage. In some other embodiments, the read VTH may be greater than the threshold voltage and the write VTH may be less than the threshold voltage.

As such, increased memory read throughput and write throughput may be achieved. In specific examples, the memory read throughput and the memory write throughput may be similar when using the first type read commands of the constricted read operations and the first type write commands of the constricted write operations. Moreover, as mentioned above, the drawn-out read commands and drawn-out write commands may be used to satisfy the error correction rate of the memory device 200.

That said, to set a low-resistance state, the memory cell 204-*a* may be heated by passing a current through the memory cell 204-*a*. Heating caused by electrical current flowing through a material that has a finite resistance may be referred to as Joule or Ohmic heating. Joule heating may thus be related to the electrical resistance of the electrodes or the phase change material. Heating the phase change material to an elevated temperature (but below its melting temperature) may result in the phase change material crystallizing and forming the low-resistance state.

In some embodiments, the memory cell 204-*a* may be heated by means other than Joule heating, for example, by using a laser. To set a high-resistance state, the phase change material may be heated above its melting temperature, for example, by Joule heating. The amorphous structure of the molten material may be quenched, or locked in, by abruptly removing the applied current to quickly cool the phase change material.

FIG. 4 is a flowchart of a process 400 for selecting a target memory cell (e.g., the memory cell 204-*a* of FIG. 3) from a set of memory cells 204 associated with the memory device 100 or 200 described above. A memory controller, such as the memory controllers 108 of FIG. 1 and/or the memory controller 216 of FIG. 2, may perform the process 400. However, it should be understood that any suitable processing circuit may additionally or alternatively perform the process 400. Furthermore, although the process 400 is described below as being performed in a particular order, it should be understood that one or more of the steps of the process 400 may, for example, be omitted or reordered.

As discussed above, in specific embodiments, the first type read commands may correspond to a number of pulses (e.g., clock cycles or commands) less than a threshold number of pulses (or the first type read commands may correspond to a time period shorter than a threshold time period) and the second type read commands may correspond to a number of pulses greater than the threshold number of pulses (or the second type read commands may correspond to a time period longer than a threshold time period). In different embodiments, the second type read commands of the drawn-out read operations may correspond to a number of pulses greater than a number of pulses of the first type read commands (or a longer time period) of the constricted read commands based on a factor of 2, 3, 4, 5, 6, 7, 8, 9, 20, etc.

In yet different embodiments, the first type read commands may be executed during a time frame that is shorter than a time frame of the second type read commands, for example, the first type commands may be executed over a set of clock cycles less than a threshold number of clock cycles and the second type commands may be executed over a set of clock cycles greater than the threshold number of clock cycles.

The process 400 may be performed based on receiving a first type read command, a second type read command, a first type write command, or a second type write command. That is, the memory controller may select the target memory cell using the process 400 based on receiving any of the first type or the second type read/write commands described above. With that in mind, at block 402, the memory controller may receive instructions that may include an address of a target memory cell (e.g., the memory cell 204-*a*). In some embodiments, the address may be a logical address. In such embodiments, the memory controller may convert the logical address to a physical address. In other embodiments, the memory controller may receive the physical address.

The memory controller may provide the physical address to the respective row decoder and column decoder for making certain control decisions. For example, at block 404, the memory controller may use the physical address to determine which row decoder and column decoder to use to select the target memory cell. In one example, the row decoder may be the row decoder 212 and the column decoder may be the column decoder 214 described with respect to FIG. 2.

In conjunction with block 404, the memory controller may look-up an indication of the row decoders and the column decoders in a memory, such as through use of a query of a database, and/or perform address arithmetic, to determine which row decoders and column decoders corresponds to the physical address of the target memory cell. Such database may be populated at a time of manufacturing of the respective memory devices 100 and/or 200. In some embodiments, the database may also become adjusted during operation of the memory devices 100 and/or 200 to reflect any logical-to-physical address assignments.

At block 406, the memory controller may use the selected row decoder and column decoder to transmit a selection current to the target memory cell. In specific embodiments, the memory controller may leverage physical distances between the memory cells 204, the row decoder 212, and the column decoder 214 to minimize an impact that activation of the row decoders 212 and column decoders 214 initially has on the memory cells (e.g., to reduce current spikes).

Moreover, in the 3D memory array architectures described above, each of the memory cells 204 may correspond to two column decoders 214 for its corresponding of the bit lines 210 and two row decoders 212 for its corresponding of the word lines 208. The memory controller 108 and/or 216 may leverage factors discussed above to determine which of the two decoders for the bit lines 210 and the word lines 208 may be activated.

Furthermore, when performing the constricted memory operations using the first type read command or the first type write commands, the memory controller may receive and provide instructions to the selected row decoder and column decoder using a first number of pulses. However, when performing the drawn-out memory operations using the second type read commands or the second type write commands, the memory controller may receive and provide instructions to the selected row decoder and column decoder using a second number of pulses that is greater than the first number of pulses. For example, the additional instructions (e.g., pulses) of the long read commands or the long write commands may provide additional error correction capability when accessing the target memory cell.

In some embodiments, the memory controller may trigger the use of the drawn-out read operations and the drawn-out write operations based on a triggering event, for example, based on a minimum error correction rate of the memory devices 100 and/or 200. Accordingly, when performing the process 400 repeatedly using the combination of first type and second type read/write commands, the memory devices 100 and/or 200 may provide memory increased read and write throughput while satisfying a respective error correction rate and reducing memory power consumption.

As mentioned above, the second type read commands may include more robust ECC with increased ECC correction capability. For example, in different embodiments, the first type read commands may use an error correction scheme that may detect 1 or 2 error and correct 0 or 1 of the detected errors whereas the second type read commands may detect 2, 3, 4, etc. errors and correct 1, 2, 3, etc. of the detected errors. In some specific embodiments, the second type read commands may detect and correct more than predetermined numbers for error detection and/or correction and the first type read commands may detect and correct less than the predetermined numbers for error detection and/or correction.

Nevertheless, at block 408, the memory controller may employ sense components (e.g., the sense components 218 and/or 222) to determine if the target memory cell has been selected correctly by the selected row decoders and column decoders. In some embodiments, the sense components are coupled directly to the word lines 208 and the bit lines 210 to ensure correct sensing of the selection current being transmitted to the target memory cell.

The sense components may indicate whether the operations of the process 400 resulted in an erroneous access operation. In some embodiments, the memory controller may trigger the use of the drawn-out read/write operations using the second type read/write commands based on detecting an erroneous access operation. For example, the memory devices 100 and/or 200 may use the constricted read/write operations using the first type read/write commands (by default) and the memory controller may trigger using the drawn-out read/write operations with the second type read/write commands upon detecting the erroneous access operation.

FIG. 5A is a process 500 depicting memory read process performed by a memory device, such as the memory devices 100 and/or 200 described above. Systems that include a memory device may value low read latency and high read throughput at the lowest power. However, using longer (and more complex selection pulse/wave) read instructions of the second type read commands during the read process may provide a more robust error performance and reduced bit error rate. Moreover, using the second type read commands may increase the read latency and the power consumption of the memory device.

Accordingly, as described above and delineated below, using multiple (e.g., at least two) sets or groupings of read commands with shorter and longer memory read instructions (e.g., the first type and second type read instructions) may facilitate reduced read latency (e.g., by a factor of 2, 3, 4, 5, etc.) and high throughput (e.g., by a factor of 2, 3, 4, 5, etc.) at the lowest power. In one example, the first type read commands and the second type read commands may be generated by a processing component associated with the system including the memory device. In some embodiments, a memory controller, such as the memory controllers 108 and/or 216 described above, may perform all or a portion of the process 500. However, it should be appreciated that in different embodiments, different components may perform the process 500.

With the foregoing in mind, at block 502, the memory device may perform a constricted read operation by executing a first type read command. The first type read command may include the first type read instructions that may reduce the read latency when performing the read operations. However, the first type read instructions may include limited error correction instructions. Accordingly, using the first type read instructions may occasionally result in uncorrectable read operations. For example, performing memory read operations using the first type read commands may result in a read error correction rate that may be less than a specified (e.g., predetermined, selected, or minimum) read error correction rate of the memory device.

At decision block 504, the memory device may determine whether a triggering event occurred. Upon occurrence of the triggering event, the memory device may proceed to operations of block 506 to perform drawn-out read operations by executing one or more second type read commands. In different embodiments, the one or more second type read commands may refresh/rewrite the respective memory cells or extend the time utilized to re-read the data from the respective memory cells. Moreover, the number of the second type read commands (one or more second type read commands) of block 506 may be determined based on a protocol used with the first type read commands and a protocol used with the second type read commands. For example, the number of the second type read commands may be proportional to error correction capability of the data protocol used for providing the first type read commands, the second type read commands, or both. The memory device may use the second type read commands to improve the bit error correction rate of the memory device when performing read operations using the first type read commands.

In some embodiments, the read protocols (e.g., underlying algorithms) used with the first type read commands and the second type read commands may be different. In specific embodiments, fewer error correction instructions may be included with the first type read commands. Accordingly, the triggering event of block 504 may be determined (or predetermined) based on different characteristics of the read protocols used with the first type read commands and the second type read commands. For example, in different embodiments, the first type read commands and the second type read commands may include different number of pulses (e.g., instructions), correspond to different amount of execution time, provide different error correction capabilities, among other things.

In a first embodiment, the triggering event may correspond to a threshold number of executed first type read commands. In the first embodiment, the memory device may count the number of executed first type read commands for determining whether the triggering event has occurred. Subsequently, upon detecting execution of the threshold number of the first type read commands, the memory device may trigger execution of the one or more second type read commands at block 506. However, when the number of executed first type read commands is less than the threshold number, the memory device may continue performing read operations by executing another first type read command by returning to the block 502.

In a second embodiment, the triggering event may correspond to a threshold amount of time associated with executing the first type read commands at block 504. In the second embodiment, the memory device may count the time before triggering execution of one or more second type read commands at block 506. In one example, the threshold amount of time for execution of the first type read commands corresponds to a predetermined time for preventing uncorrectable memory read operations based on an error correction capability of the first type read commands. Moreover, the memory device may also reset the counter when the threshold amount of time has passed. Furthermore, when the threshold amount of time is not passed, the process 500 may return to the operations of block 502 to continue performing read operations by executing another first type read command at block 502.

In a third embodiment, the triggering event may correspond to detecting an uncorrectable read operation. That is, the memory device may monitor the read data for determining whether an uncorrectable read operation has occurred. Subsequently, the memory device may trigger execution of one or more second type read commands at block 506 when detecting an uncorrectable read operation. However, when executing a first type read command at block 502 does not result in an erroneous read operation, the memory device may continue performing read operations by executing another first type read command at block 502 (returning to the operations of block 502). It should be appreciated that different combination of the triggering events may also be used as well as other triggering events.

Nevertheless, using the process 500, the memory device may perform read operations by providing increased memory throughput and less power consumption while satisfying a specified (e.g., predetermined, selected, or minimum) memory read error correction rate. In some embodiments, a system may impose the memory read error correction rate. As such, the memory device may satisfy the read error correction rate by including less error correction instructions when performing the process 500 repeatedly.

FIG. 5B is a process 520 depicting memory write process performed by a memory device, such as the memory devices 100 and/or 200 described above. Systems that include a memory device may value increased write throughput at the lowest power. However, using longer (e.g., and more complex selection pulse/wave) write instructions of the second type commands during the drawn-out write operations may provide a more robust error performance and reduced bit error rate which reduces the write throughput and the power consumption of the memory device.

Accordingly, using multiple (e.g., at least two) sets or groupings of write commands with shorter and longer memory write instructions (e.g., the first type and second type instructions) may facilitate increased write throughput at the lowest power. In one example, the first type write commands and the second type write commands may be generated by a processing component associated with the system including the memory device. In some embodiments, a memory controller, such as the memory controllers 108 and/or 216 described above, may perform all or a portion of the process 520. However, it should be appreciated that in different embodiments, different components may perform the process 520.

With the foregoing in mind, at block 522, the memory device may perform a constricted write operation by executing a first type write command. The first type write command may include first type write instructions that may reduce the write completion time when performing the constricted write operations. However, the first type write instructions may include limited error correction instructions. Accordingly, using the first type write instructions may occasionally result in uncorrectable write operations. For example, performing memory write operations using the first type write commands may result in a write error correction rate that may be less than a specified (e.g., predetermined, selected, or minimum) write error correction rate of the memory device.

At decision block 524, the memory device may determine whether a triggering event occurred. Upon occurrence of the triggering event, the memory device may proceed to operations of block 526 to perform drawn-out write operations by executing one or more second type write commands. In different embodiments, the one or more second type write commands may refresh/rewrite the respective memory cells or extend the time to re-write the data to the respective memory cells. Moreover, the number of second type write commands (one or more second type write commands) of block 526 may be determined based on a protocol used with the first type write commands and a protocol used with the second type write commands. For example, the number of the second type write commands may be proportional to error correction capability of the data protocol used for providing the first type write commands, the second type write commands, or both. The memory device may use the second type write commands to improve the bit error correction rate of the memory device when performing write operations using the first type write commands.

In some embodiments, the write protocols (e.g., underlying algorithms) used with the first type write commands and the second type write commands may be different. In specific embodiments, fewer error correction instructions may be included with the first type write commands. Accordingly, the triggering event of block 524 may be determined (or predetermined) based on different characteristics of the write protocols used with the first type write commands and the second type write commands. For example, in different embodiments, the first type write commands and the second type write commands may include different number of pulses (e.g., instructions), correspond to different amount of execution time, provide different error correction capabilities, among other things. In one embodiment, the triggering event may be based on whether an error count, when using the first type write commands, exceeds an error correction capability of the respective protocol used with the first type write commands.

In a first embodiment, the triggering event may correspond to a threshold number of executed first type write commands. In the first embodiment, the memory device may count the number of executed first type write commands for determining whether the triggering event has occurred. Subsequently, upon detecting execution of the threshold number of first type write commands, the memory device may trigger execution of the one or more second type write commands at block 526. However, when the number of executed first type write commands is less than the threshold number, the memory device may continue performing write operations by executing another first type write command by returning to the block 522.

In a second embodiment, the triggering event may correspond to a threshold amount of time associated with executing the first type write commands at block 524. In the second embodiment, the memory device may count the time before triggering execution of one or more second type write commands at block 526. In one example, the threshold amount of time for execution of the first type write commands corresponds to a predetermined time for preventing uncorrectable memory write operations based on an error correction capability of the first type write commands. Moreover, the memory device may also reset the counter when the threshold amount of time has passed. Furthermore, when the threshold amount of time is not passed, the process 520 may return to the operations of block 522 to continue performing write operations by executing another first type write command at block 522.

In a third embodiment, the triggering event may correspond to detecting an uncorrectable write operation. That is, the memory device may monitor the write data for determining whether an uncorrectable write operation has occurred. Subsequently, the memory device may trigger execution of one or more second type write commands at block 526 when detecting an uncorrectable write operation. However, when executing a first type write command at block 522 does not result in an erroneous write operation, the memory device may continue performing write operations by executing another first type write command at block 522 (returning to the operations of block 522). Moreover, it should be appreciated that different combination of the triggering events may also be used as well as other triggering events.

For example, the memory device may check the validity of the written data on the respective memory cells when monitoring for the triggering event at block 524. The memory device may continue using the first type write commands when no uncorrectable errors are detected. However, upon detection of an erroneous write operation, the memory device may trigger using one or more second type write commands to re-write the erroneous data to ensure performing correct write operation at block 526. In some embodiments, the second type write commands may include different write algorithm from the first type write command. Moreover, the second type write command may provide a more robust write performance compared to the first type write commands.

Nevertheless, using the process 520, the memory device may perform constricted and drawn-out write operations by providing increased memory throughput and reduced power consumption while satisfying a specified (e.g., predetermined, selected, or minimum) memory write error correction rate. In some embodiments, a system may impose the memory write error correction rate. As such, the memory device may satisfy the write error correction rate by including less error correction instructions when performing the process 520 repeatedly.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An electronic device, comprising:
   a memory array comprising a plurality of memory cells; and
   a memory controller configured to perform memory read operations on the memory array by:
      transmitting a plurality of first read commands using first read instructions to read first data values stored in a first one or more memory cells of the plurality of the memory cells, wherein the plurality of first read commands are each executed or are in total executed using a first number of pulses less than a threshold number of pulses; and
      transmitting one or more second read commands using second read instructions to read second data values stored in a second one or more memory cells of the plurality of memory cells, wherein the one or more second read commands are each executed or are in total executed using a second number of pulses greater than the threshold number of pulses.

2. The electronic device of claim 1, wherein the memory controller is configured to provide the second read instructions in conjunction with a first level of error correction to the first data values.

3. The electronic device of claim 2, wherein the memory controller is configured to provide the first read instructions in conjunction with a second level of error correction to the second data values.

4. The electronic device of claim 1, wherein the memory controller is configured to transmit the one or more second read commands based on detecting a triggering event.

5. The electronic device of claim 4, wherein the memory controller is configured to detect the triggering event based upon a number of the plurality of first read commands transmitted or based upon an amount of time elapsed related to transmission of the plurality of first read commands.

6. The electronic device of claim 4, wherein the memory controller is configured to detect the triggering event when an erroneous memory read operation occurs when transmitting the plurality of first read commands.

7. The electronic device of claim 1, wherein the memory controller is configured to generate the first read instructions using a first data protocol and generate the second read instructions using a second data protocol different from the first data protocol.

8. The electronic device of claim 1, wherein the memory controller is configured to:
   provide the first read instructions as corresponding to a first read latency; and
   provide the second read instructions as corresponding to a second read latency, wherein the second read latency is greater than the first read latency.

9. The electronic device of claim 8, wherein the memory controller is configured to:
   perform the memory read operations with increased data throughput by providing the first read instructions; and
   perform memory read operations with higher latency by providing the second read instructions.

10. The electronic device of claim 9, wherein the memory controller is configured to perform the memory read operations with reduced power consumption when using the first read instructions relative to the second read instructions based on the increased data throughput.

11. The electronic device of claim 1, wherein the memory array comprises a 3-dimensional memory array.

12. The electronic device of claim 9, wherein the memory controller is configured to perform the memory read operations by transmitting one or more third read commands using the second read instructions to read the first data values stored in the first one or more memory cells of the plurality of the memory cells, wherein the one or more third read commands are each executed or are in total executed using the second number of pulses greater than the threshold number of pulses.

13. An electronic device, comprising:
a memory array comprising a plurality of memory cells; and
a memory controller configured to perform memory write operations on the memory array by:
    transmitting a plurality of first write commands using first write instructions to write first data values to a first one or more memory cells of the plurality of memory cells, wherein the plurality of first write commands are each executed or are in total executed using a first number of pulses less than a threshold number of pulses; and
    transmitting one or more second write commands using second write instructions to write second data values to a second one or more memory cells of the plurality of memory cells, wherein the one or more second write commands are each executed or are in total executed using a second number of pulses greater than the threshold number of pulses.

14. The electronic device of claim 13, wherein the memory controller is configured to:
    transmit the second write instructions in conjunction with a first level of error correction to the first data values; and
    transmit the first write instructions in conjunction with a second level of error correction to the second data values.

15. The electronic device of claim 13, wherein the memory controller is configured to transmit the one or more second write commands based on detecting a triggering event, wherein the triggering event is based on the memory controller detecting:
    an erroneous memory write operation when transmitting the plurality of first write commands;
    transmission of a threshold number of the first write commands;
    a threshold amount of time having transpired during transmission of the plurality of first write commands; or
    any combination thereof.

16. The electronic device of claim 13, wherein the memory controller is configured to generate the plurality of first write commands using a first data protocol and generate the one or more second write commands using a second data protocol different from the first data protocol.

17. The electronic device of claim 13, wherein the memory controller is configured to provide the first write instructions based on a first completion time shorter than a threshold time and provide the second write instructions based on a second completion time longer than the threshold time, wherein the first completion time results in increased memory write throughput when performing the memory write operations.

18. A tangible, non-transitory, computer-readable medium storing instructions executable by one or more processors in a computing system, wherein the instructions comprise instructions to:
    perform, using the one or more processors, memory read operations on a first plurality of memory cells of a memory device using first read commands and second read commands, wherein a memory controller of the memory device is configured to utilize long read commands as the second read commands based on detection of a first triggering event; and
    perform, using the one or more processors, memory write operations on a second plurality of memory cells of the memory device using first write commands and second write commands, wherein the memory controller of the memory device is configured to utilize long write commands as the second write commands based on detection of a second triggering event.

19. The tangible, non-transitory, computer-readable medium of claim 18, wherein the instructions to perform the memory read operations comprise instructions to utilize the first read commands in an absence of the first triggering event, wherein the instructions to perform the memory write operations comprises instructions to utilize the first write commands in an absence of the second triggering event.

20. The tangible, non-transitory, computer-readable medium of claim 18, wherein the first read commands are generated based on instructions to utilize a first read data protocol and the second read commands are generated based on instructions to utilize a second read data protocol different from the first read data protocol, wherein the first write commands are generated based on instructions to utilize a first write data protocol and the second write commands are generated based on instructions to utilize a second write data protocol different from the first write data protocol.

21. The tangible, non-transitory, computer-readable medium of claim 18, wherein instructions to utilize the first read commands correspond to a reduced read delay compared to the second read commands, wherein the reduced read delay results in increased memory read throughput when performing the memory read operations, wherein instructions to utilize the first write commands correspond to a shorter write completion time compared to the second write commands, wherein the shorter write completion time results in increased memory write throughput when performing the memory write operations.

* * * * *